United States Patent
Kumar et al.

(10) Patent No.: US 6,351,151 B2
(45) Date of Patent: Feb. 26, 2002

(54) METHOD AND APPARATUS FOR REDUCING SOFT ERRORS IN DYNAMIC CIRCUITS

(75) Inventors: Sudarshan Kumar, Fremont; Wenjie Jiang, Sunnyvale, both of CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/909,104

(22) Filed: Jul. 18, 2001

Related U.S. Application Data

(63) Continuation of application No. 09/471,650, filed on Dec. 23, 1999.

(51) Int. Cl.[7] ............... H03K 19/096; H01L 31/119
(52) U.S. Cl. ........................................... 326/98; 326/95
(58) Field of Search ............... 326/95, 96, 97, 326/98; 257/297

(56) References Cited

U.S. PATENT DOCUMENTS

| | | | |
|---|---|---|---|
| 4,040,015 A | * | 8/1977 | Fukuda ............ 365/104 |
| 4,849,658 A | | 7/1989 | Iwamura et al. |
| 5,065,048 A | | 11/1991 | Asai et al. |
| 5,103,113 A | | 4/1992 | Inui et al. |
| 5,144,163 A | | 9/1992 | Matsuzawa et al. |
| 5,557,620 A | | 9/1996 | Miller, Jr. et al. |
| 6,111,434 A | | 8/2000 | Ciraula et al. |
| 6,191,618 B1 | | 2/2001 | Gayles et al. |

* cited by examiner

Primary Examiner—Michael Tokar
Assistant Examiner—David D. Chang
(74) Attorney, Agent, or Firm—Cynthia T. Faatz

(57) ABSTRACT

A technique for reducing soft errors in a dynamic circuit. For one embodiment, a dynamic circuit includes a dynamic logic gate having an output node at which a logical output value of the logic gate is detected. A keeper circuit coupled to the output node is configured to harden the dynamic circuit by increasing the critical charge at the output node.

10 Claims, 2 Drawing Sheets

METHOD AND APPARATUS FOR REDUCING SOFT ERRORS IN DYNAMIC CIRCUITS

The present application is a continuation of copending U.S. patent application Ser. No. 09/471,650, filed Dec. 23, 1999, which application has a common title and assignee with the present application.

BACKGROUND

1. Field

An embodiment of the present invention relates to the field of integrated circuits and, more particularly, to reducing soft errors in integrated circuits that include dynamic circuits.

2. Discussion of Related Art

Dynamic circuits, such as domino circuits, for example, are widely used in high-speed integrated circuit designs. This is because dynamic circuits typically provide area and speed advantages over corresponding static complementary metal oxide semiconductor (CMOS) circuits.

Dynamic circuits, however, are more vulnerable to soft errors as compared to their static counterparts. A soft error is a transient, single event upset that changes the state of a circuit node or other internal storage element. Soft errors may, for example, be caused by alpha particles or cosmic rays impinging on the integrated circuit device.

Alpha particles are charged particles that may originate from the decay of trace impurities in integrated circuit packaging materials, for example. Cosmic rays may include heavy ions and protons that, either directly or indirectly, may have an ionization effect within the integrated circuit device semiconductor material. In either case, the charged particles from these sources may change the charge at an integrated circuit node such that the node actually transitions to an opposite logical state.

The critical charge (Qcrit) at a node is an indication of the susceptibility of the node to such soft errors. Qcrit is the minimum charge beyond which operation of a circuit will be affected. Thus, if an ion strike causes charge collected at a node to exceed Qcrit, the node may erroneously transition from a logical one state to a logical zero state, for example.

As integrated circuit fabrication technologies continue to scale down into the submicron region, less charge is stored on integrated circuit nodes and thus, less energy is needed to change the state of a node. For this reason, integrated circuit devices are becoming increasingly susceptible to soft error failures.

One approach to addressing this issue has been to add error detection and/or correction circuitry to integrated circuit designs. This approach may be used in memory design, for example. Error detection and/or correction circuitry identifies circuit errors such that resulting issues may be mitigated while correction circuitry may compensate for the error. Such approaches, while preventing some circuit failures, can involve significant additional circuitry that takes up valuable semiconductor real estate. Additionally, such approaches may not be viable for dynamic circuits in speed critical paths, for example.

Other approaches may involve processing changes. For some dynamic random access memory (DRAM) cells, for example, gate oxide thicknesses are decreased to store additional charge. This approach, however, may lead to an increase in other types of failures due to increased defects in the thinner gate oxide.

Other processing changes such as use of trench-capacitor structures, and applying a coating of a radioactive-contaminant-free polymer on top of an integrated circuit have also been used in an effort to reduce soft errors. Such processing changes may be undesirable because they add one or more additional processing steps involving additional time and expense. Further such approaches may not reduce soft errors to the extent desired.

SUMMARY OF THE INVENTION

A method and apparatus for reducing soft errors in a dynamic circuit are described. For one embodiment, a dynamic circuit includes a dynamic logic gate having an output node at which a logical output value of the logic gate is detected. A keeper circuit coupled to the output node is configured to harden the dynamic circuit by increasing the critical charge at the output node.

Other features and advantages of the present invention will be appreciated from the accompanying drawings and from the detailed description that follows below.

BRIEF DESCRIPTION OF THE DRAWINGS

The present invention is illustrated by way of example and not limitation in the figures of the accompanying drawings in which like references indicate similar elements, and in which.

DETAILED DESCRIPTION

A method and apparatus for reducing soft errors in dynamic circuits is described. In the following description, particular types of integrated circuits and integrated circuit configurations are described for purposes of illustration. It will be appreciated, however, that other embodiments are applicable to other types of integrated circuits and to integrated circuits configured in another manner.

Figure 1:
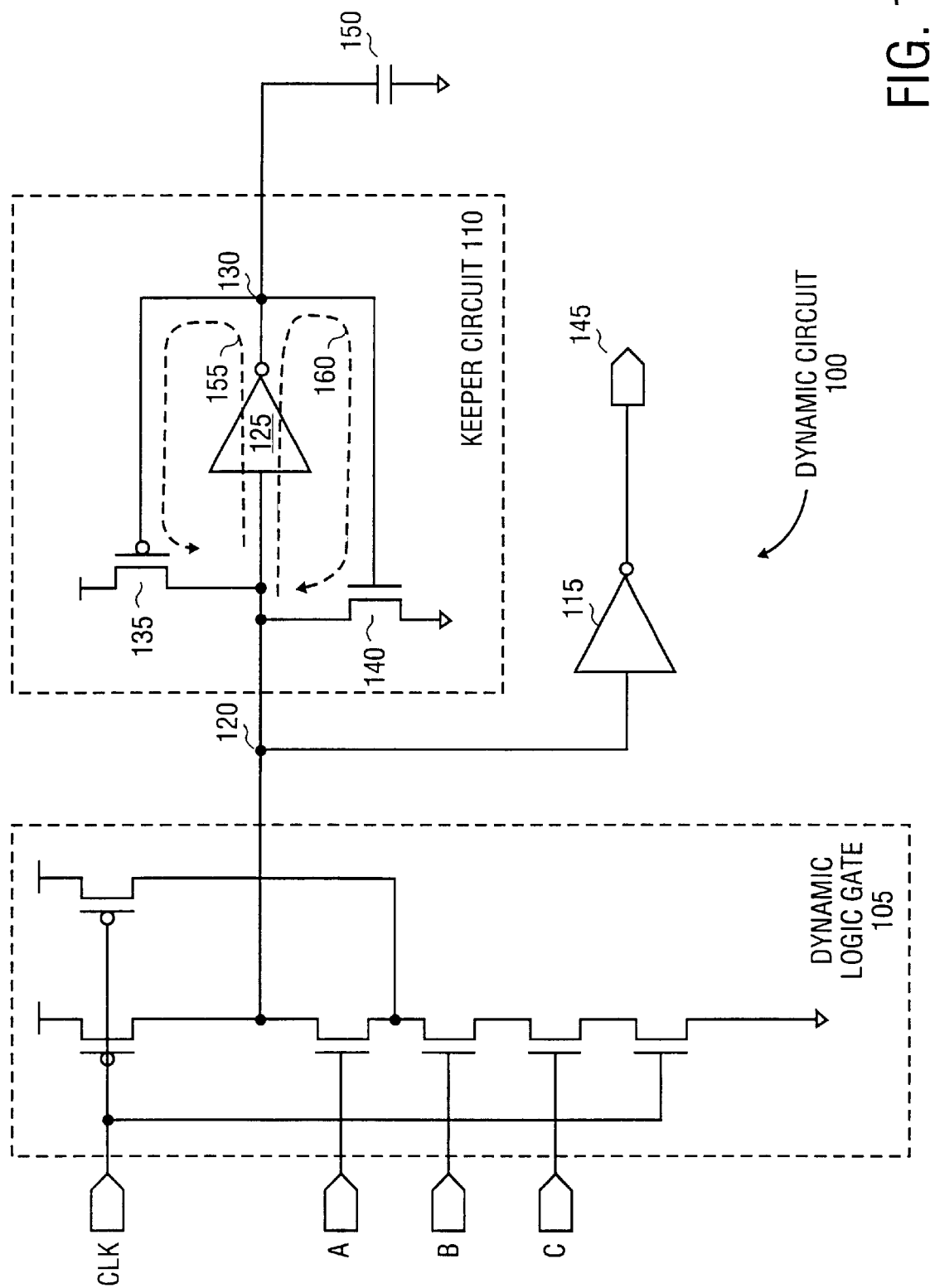
FIG. 1 is a schematic diagram of a dynamic circuit in accordance with one embodiment.

FIG. 1 is a schematic diagram of a dynamic circuit 100 in accordance with one embodiment. The dynamic circuit 100 includes a dynamic logic gate 105, a keeper circuit 110, and an interface inverter 115 (or another type of interface gate such as a complex gate).

The dynamic logic gate 105 for the example shown in FIG. 1 is a three-input domino NAND gate, however, other types of dynamic logic gates, including other types of domino gates, may also benefit from various embodiments of the invention. The dynamic logic gate 105 includes data inputs A, B and C and a clock input CLK. Output data from the dynamic logic gate 105 is provided at an output node 120, which may also be referred to as a precharge node. During a precharge phase, the output/precharge node 120 may be precharged to a predetermined level (a logical high level in this example) and during an evaluate phase, an output value may be read at the node 120.

The keeper circuit 110 includes a first inverter 125 having an input coupled to the output node 120 and an output coupled to a feedback node 130. Also coupled to the feedback node 130 is an input of a second inverter including a p-channel metal oxide semiconductor (PMOS) keeper device 135 and an n-channel MOS (NMOS) keeper device 140. An output of the second inverter is coupled to the output node 120.

The keeper circuit 110 operates to maintain a voltage level at the output node 120. In operation, the keeper circuit 110 supplies charge to compensate for loss of charge at the output node 120 due to various leakage paths and capacitive coupling of the output node 120 to other signal paths. The keeper circuit 110 of FIG. 1 is a full keeper (i.e. it is switchable to maintain the output node 120 at either a logical high or a logical low level). For other embodiments, a half keeper circuit that only maintains the output node at one level (either high or low) may be used in place of the full keeper 110.

The interface inverter 115 for the exemplary circuit shown in FIG. 1 is a gate that provides an interface to subsequent logic (not shown). The interface inverter 115 may be provided, for example, so that a domino circuit coupled to the dynamic circuit 100 is in a precharge phase while the dynamic circuit 100 is in an evaluate phase to ensure proper operation of the coupled circuits. The interface inverter 115 may be a high-skewed gate for one embodiment such that transitions in a particular direction are favored.

As mentioned above, the dynamic circuit 100 provides a logical output value from the logic gate 105 at the output node 120. Subsequent logic (not shown) coupled to the dynamic circuit at the node 145, for example, may use the logical output value at the node 120 as an input. Thus, a soft error at the node 120 could cause incorrect data to be supplied to the subsequent logic.

For one embodiment, to harden the dynamic circuit 100 such that it is less prone to soft errors, a hardening capacitor 150 is coupled to the keeper circuit 110 at the feedback node 130. The hardening capacitor 150 operates to slow down a feedback path within the keeper circuit 110 such that the gate 135 is on longer to maintain charge at the node 120. In this manner, a critical charge (Qcrit) at the node 120 is effectively increased such that the node 120 is less prone to soft errors. In other words, with a higher Qcrit, a larger amount of charge would have to be generated by an alpha particle, proton or heavy ion to cause a soft error as compared to a similar circuit without the hardening capacitor 150.

For a logical high output at the node 120, the above-mentioned feedback path or loop is indicated by the dotted line 155 and includes the inverter 125 and the PMOS keeper device 135. If the node 120 is at a logical low level, the feedback path through the keeper circuit would, instead, include the inverter 125 and the NMOS keeper device 140 as indicated by the dotted line 160. Because the dynamic logic gate 105 is a domino gate for the example shown in FIG. 1, and domino gates more typically exhibit soft errors that cause an erroneous transition from a logic high level to a logic low level, the examples described herein are focused on this type of error. The hardening capacitor 150 may also be used, however, to harden dynamic circuits against soft errors that cause erroneous low to high transitions.

Using the above approach, Qcrit at the output node 120 can be increased to harden the dynamic circuit 100 against soft errors without increasing the signal delay from the CLK and data (A,B,C) inputs to the node 145. These clock and data signal output paths determine the speed of the dynamic circuit 100 with respect to surrounding logic.

The increase in Qcrit for this approach depends on several factors including the capacitance of the hardening capacitor 150, the sizes of the keeper devices 135 and/or 140, and the equivalent capacitance at the output node 120. For one embodiment, the hardening capacitor 150 is a 5.6 $\mu$m by 0.4 $\mu$m gate capacitance. For other embodiments, however, other types of capacitors and/or different capacitance values may be used.

In general, the larger the capacitance provided by the hardening capacitor 150, the larger the increase in Qcrit. In determining the size of the hardening capacitor 150, an integrated circuit designer may balance a desired increase in Qcrit versus a resultant reduction in slope of signals at the feedback node 130 caused by the addition of the hardening capacitor 150. If the slope at the feedback node 130 becomes too gradual, the time to turn on or turn off the keeper devices 135 and/or 140 becomes too long such that the performance of the circuit 100 may be adversely affected. Other factors such as the particular process being used, the area penalty that can be tolerated, etc. may also be considered.

For another embodiment, to further increase Qcrit at the output node 120, one of the keeper device 135 or 140 may be sized to further fight charge loss at the output node 120. If the concern is for soft errors that cause erroneous transitions from a logic high to a logic low state, for example, the PMOS keeper device 135 may be sized to increase its pull-up strength. To harden the circuit 100 against soft errors that cause transitions from a logic low to a logic high state, the NMOS keeper device 140 may be sized to increase its pull-down strength. For some embodiments, both pull-up and pull-down keeper devices may be sized in the above-described manner.

Use of the hardening capacitor 150 coupled to the keeper circuit feedback node 130 in conjunction with sizing of one or more of the keepers 135 and/or 140 can significantly improve Qcrit at the output node 120 with limited performance loss. Increasing the strength of one or more of the keepers 135 and/or 140 increases delay in the path between the CLK input and the node 145 and the path between the data inputs A, B and C and the node 145. Thus, the extent to which the keeper(s) 135 and/or 140 are resized will depend, at least in part, on the delay that can be tolerated in the clock and/or data output paths (i.e. CLK to node 145 and inputs A, B and C to node 145).

The PMOS keeper 135 may, for example, be resized from 0.56/0.6 $\mu$m (width/channel length) to 0.76/0.4 $\mu$m to provide increased pull-up strength and a higher Qcrit at the output node 120 to harden the circuit 100 against erroneous high to low transitions. It will be appreciated that the above dimensions are exemplary and that different dimensions for the PMOS keeper device 135 may be used depending upon tolerable delay and additional factors such as the particular circuit in which the keeper is included, the desired Qcrit at the output node 120, space considerations, etc. Similar considerations may be taken into account in sizing the NMOS keeper device 140.

Where a half keeper is used instead of a full keeper, a keeper device in the half keeper may be sized in a similar manner to improve Qcrit at the output node 120.

For another embodiment, in addition to, or instead of, sizing one or more of the keeper devices 135 and/or 140, the inverter 125 in the feedback loop(s) 155 and 160 may be sized to reduce its driving strength. For example, where the widths of the devices in the inverter 125 are not at a minimum width for the process used to fabricate the circuit 100, this width may be reduced. Where the widths of the devices in the inverter 125 are at the minimum width for the process, the channel length of the devices can be increased. Either approach results in reduced driving strength of the inverter 125. By reducing the driving strength of the inverter 125, the feedback path(s) 155 and/or 160 in the keeper circuit 110 are slowed down such that Qcrit at the node 120 is increased as described above.

Reducing the driving strength of the inverter 125 by increasing its channel length may increase the overall loading capacitance at the output node 120 to a certain extent.

For some embodiments, it may be possible to compensate for this effect by reducing the size of the inverter 115. Where this additional loading capacitance is not compensated for, a slight delay penalty may be introduced into the clock and data output paths. Available area and tolerance for delay balanced against a desired increase in Qcrit may be considered when determining sizing of the inverter 125.

Figure 2:
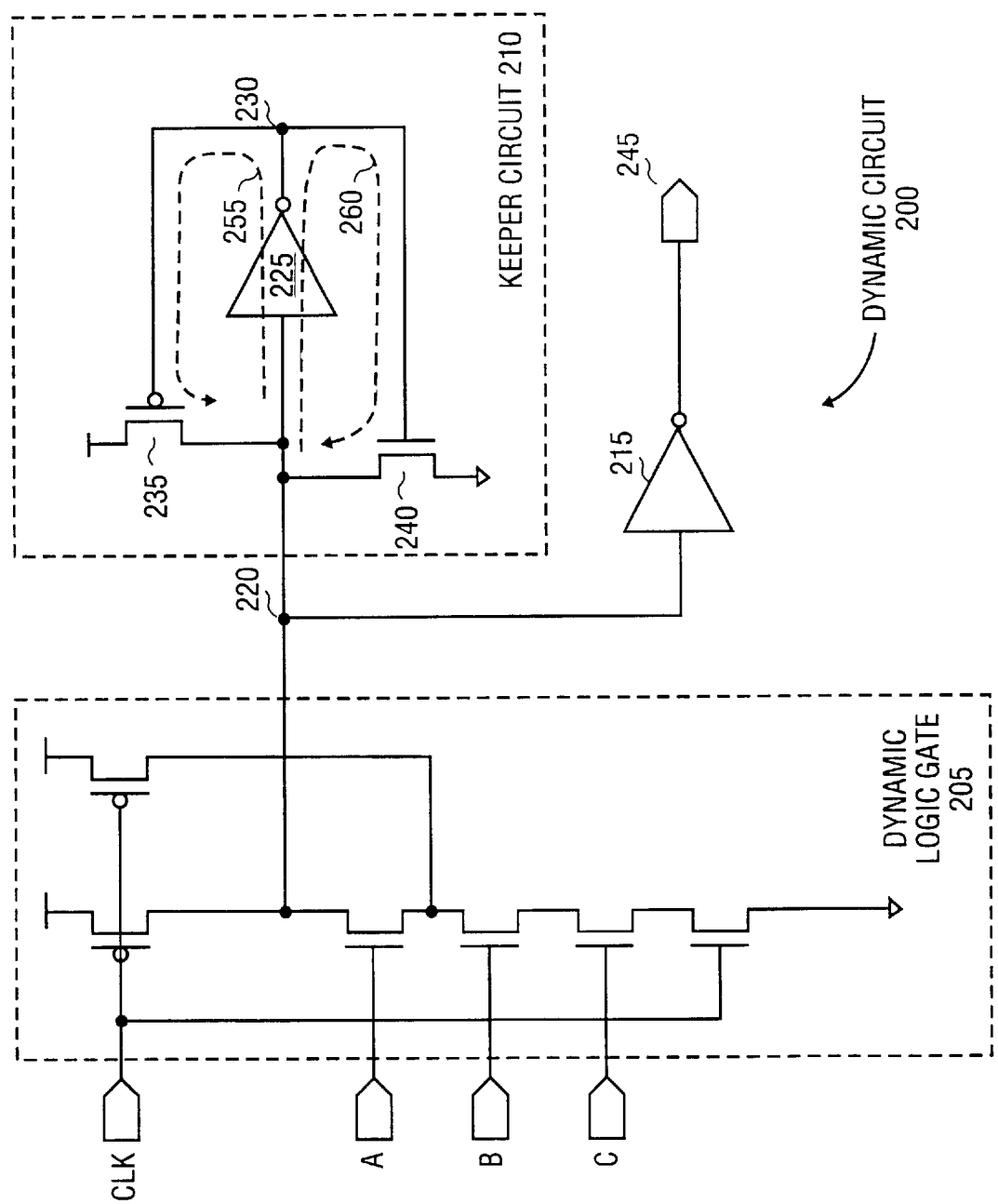
FIG. 2 is a schematic diagram of a dynamic circuit in accordance with an alternative embodiment.

FIG. 2 is a schematic diagram showing a dynamic circuit 200 of another embodiment. The dynamic circuit 200, like the circuit 100 includes a dynamic logic gate 205, a keeper circuit 210, an interface inverter 215 (or another type of interface gate such as a complex gate), and an output node 220. The dynamic logic gate 205 is also a three-input domino NAND gate in this example, but may be any type of dynamic logic gate.

For the embodiment shown in FIG. 2, the keeper circuit 210 is configured to increase Qcrit at the output node 220 without the addition of a hardening capacitor. For this embodiment, an inverter 225 in the feedback loop(s) of the keeper circuit 210 is sized to reduce its driving strength as described above in reference to the inverter 125 of FIG. 1.

As described in reference to FIG. 1, reducing the driving strength of the inverter 225 by increasing its channel length can increase the loading capacitance at the output node 220. This increased loading capacitance may introduce a small delay in a clock output path from a CLK signal to a node 245 and a data output path from data inputs A, B and C to the node 245. It may be possible, for some embodiments, to compensate for this delay by adjusting the sizing of the interface inverter 215.

For an alternative embodiment, instead of, or in addition to, sizing the inverter 225, one or more keeper devices 235 and/or 240 in the keeper circuit are sized to increase Qcrit in the manner described above in reference to the keeper devices 135 and/or 140 of FIG. 1. Similar to the keeper device 135 and 140, this sizing may also increase the delay in the clock and data output paths. This increased delay may be taken into account when determining the desired size of the keeper device(s) 235 and/or 240.

As described above in reference to FIG. 1, decreasing the driving strength of the inverter 225 operates to delay the feedback loop(s) 255 and/or 260 through the keeper circuit 210. Delaying the feedback loop(s) in the keeper circuit 210 fights against changes in charge at the output node 220 such that Qcrit at the node 220 is increased. Increasing the strength of the either or both of the keeper devices 235 and/or 240 also serves to fight against changes in charge to increase Qcrit at the output node 220. This increase in Qcrit in accordance with the above-described embodiments is provided while incurring relatively small delays in the clock and data output paths.

The above-described approaches for increasing Qcrit and thus, hardening dynamic circuits to reduce soft errors, may be used for any type of dynamic circuit in an integrated circuit such as a microprocessor, for example. For some embodiments, it may be desirable to identify particular dynamic circuits that may be more prone to soft errors and employ one or more of the described hardening techniques only to such circuits. These particular dynamic circuits may be the circuits that include smaller devices such that it is more difficult to maintain charge on internal nodes, for example.

Various embodiments may be used to harden dynamic circuits by increasing Qcrit while introducing little, if any delay penalty. This increase in Qcrit can further be accomplished without adding additional processing steps. Increases in area that may result from circuits in accordance with various embodiments may be balanced by an integrated circuit designer against desired increases in Qcrit.

Increasing Qcrit in the manner described above reduces the susceptibility of dynamic circuits to soft errors and thus, reduces the soft error Failures In Time (FIT) rate associated with devices that include such circuits. Reducing the soft error FIT rate improves integrated circuit reliability and thus, reduces manufacturing and other costs.

In the foregoing specification, the invention has been described with reference to specific exemplary embodiments thereof. It will, however, be appreciated that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A dynamic circuit comprising:
   a dynamic logic gate having an output node at which a logical output value of the logic gate is detected;
   a keeper circuit coupled to the output node, the keeper circuit including a feedback node; and
   a hardening capacitor coupled to the feedback node, the hardening capacitor to slow down a feedback path in the keeper circuit.

2. The dynamic circuit of claim 1 wherein the keeper circuit comprises:
   a first inverter coupled between the output node and a feedback node, the first inverter being sized to reduce a driving strength of the inverter to slow down the feedback path in the keeper circuit.

3. The dynamic circuit of claim 2 wherein the keeper circuit further comprises:
   a keeper device coupled to the first inverter, the keeper device being sized to further increase critical charge at the output node.

4. The circuit of claim 1 wherein the keeper circuit comprises:
   a keeper device having an input coupled to the feedback node, the keeper device being sized to fight against changes in charge at the output node.

5. The circuit of claim 4 wherein
   the dynamic logic gate is a domino gate, and
   the keeper device is a PMOS keeper device.

6. The circuit of claim 4 wherein the keeper device is an NMOS keeper device.

7. The circuit of claim 4 wherein the keeper circuit further comprises:
   an inverter coupled between the output node and the feedback node, the inverter being sized to reduce its driving strength to further harden the circuit.

8. The dynamic circuit of claim 1 wherein one terminal of the hardening capacitor is coupled to ground.

9. A method comprising:
   using a hardening capacitor coupled to a feedback node of a keeper circuit in a dynamic circuit to slow down a feedback path in the keeper circuit to harden the dynamic circuit against soft errors.

10. The method of claim 9 further comprising:
    further hardening the dynamic circuit with a keeper device that is sized to fight charge loss at an output node of the dynamic circuit.

* * * * *